(12) United States Patent
Kim et al.

(10) Patent No.: US 8,017,425 B2
(45) Date of Patent: Sep. 13, 2011

(54) METHOD FOR FABRICATING AN IMAGE SENSOR CAPABLE OF INCREASING PHOTOSENSITIVITY

(75) Inventors: Myoung-Shik Kim, Chungcheongbuk-do (KR); Hyung-Jun Kim, Chungcheongbuk-do (KR)

(73) Assignee: Crosstek Capital, LLC, Wilmington, DE (US)

( * ) Notice: Subject to any disclaimer, the term of this patent is extended or adjusted under 35 U.S.C. 154(b) by 0 days.

(21) Appl. No.: 12/385,615

(22) Filed: Apr. 14, 2009

(65) Prior Publication Data

US 2009/0321736 A1 Dec. 31, 2009

Related U.S. Application Data

(63) Continuation of application No. 11/318,638, filed on Dec. 28, 2005, now Pat. No. 7,521,315.

(30) Foreign Application Priority Data

Dec. 30, 2004 (KR) .............................. 2004-0115974

(51) Int. Cl.
*H01L 21/8234* (2006.01)

(52) U.S. Cl. .......... 438/60; 438/237; 257/233; 257/292; 257/E21.352; 250/208.1

(58) Field of Classification Search .................... 438/60, 438/237; 257/233, 292, E21.352; 250/208.1
See application file for complete search history.

(56) References Cited

U.S. PATENT DOCUMENTS

| 6,232,626 | B1 | 5/2001 | Rhodes | 257/292 |
|---|---|---|---|---|
| 6,689,692 | B1* | 2/2004 | Grover et al. | 438/691 |
| 2002/0086542 | A1* | 7/2002 | Shepard | 438/700 |
| 2002/0113233 | A1* | 8/2002 | Menut et al. | 257/46 |

FOREIGN PATENT DOCUMENTS

| KR | 1020010109144 A | 12/2001 |
|---|---|---|
| KR | 1020030041573 A | 5/2003 |

* cited by examiner

*Primary Examiner* — Steven J Fulk
(74) *Attorney, Agent, or Firm* — McAndrews, Held & Malloy, Ltd.

(57) ABSTRACT

An image sensor capable of overcoming a decrease in photo sensitivity resulted from using a single crystal silicon substrate, and a method for fabricating the same are provided. An image sensor includes a single crystal silicon substrate, an amorphous silicon layer formed inside the substrate, a photodiode formed in the amorphous silicon layer, and a transfer gate formed over the substrate adjacent to the photodiode and transferring photoelectrons received from the photodiode.

18 Claims, 15 Drawing Sheets

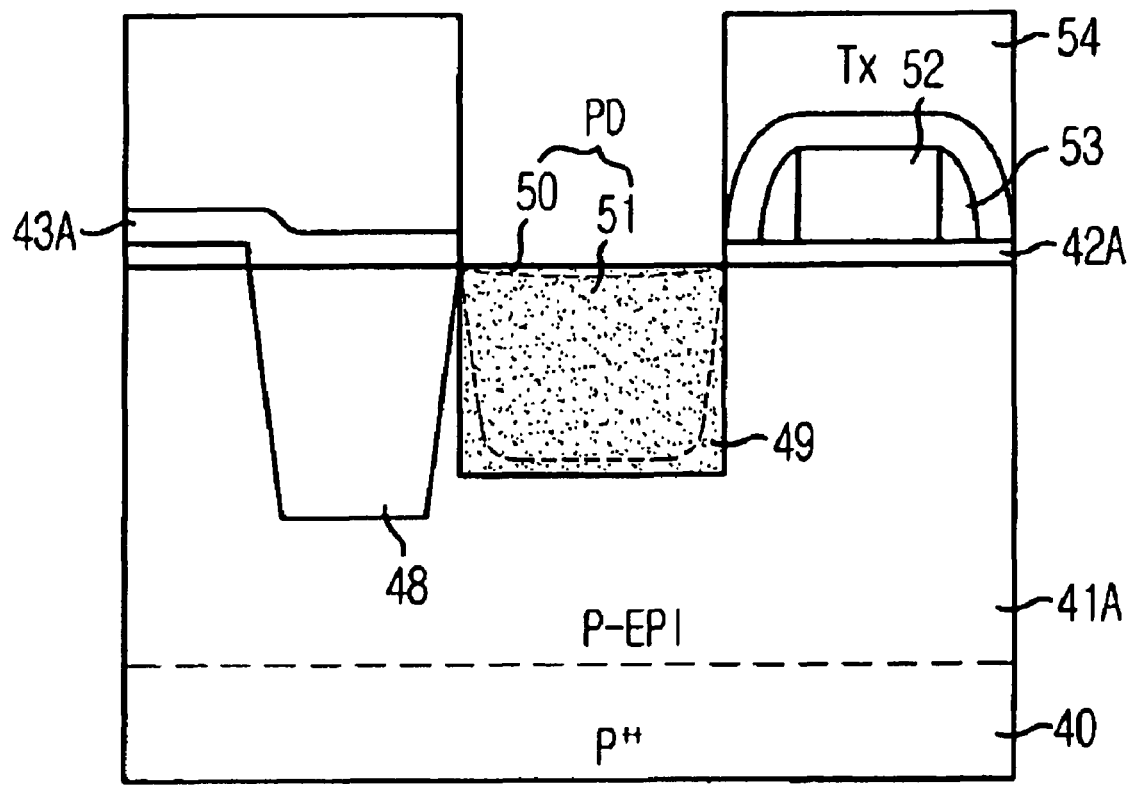

METHOD FOR FABRICATING AN IMAGE SENSOR CAPABLE OF INCREASING PHOTOSENSITIVITY

CROSS-REFERENCE TO RELATED APPLICATIONS

The present invention is a continuation application of U.S. patent application Ser. No. 11/318,638, filed on Dec. 28, 2005 and issued as U.S. Pat. No. 7,521,315, which claims the benefit of Korean Patent Application No. 10-2004-0115974, filed in Korea on Dec. 30, 2004, both of which are hereby incorporated by reference in their entirety.

FIELD OF THE INVENTION

The present invention relates to an image sensor; and more particularly, to an image sensor capable of overcoming a decrease in photosensitivity resulted from using a single crystal silicon substrate, and a method for fabricating the same.

DESCRIPTION OF RELATED ARTS

A complementary metal oxide semiconductor (CMOS) image sensor is a device widely used in mobile phones, cameras for personal computers (PC) and electrical appliances. An operation method of the CMOS image sensor is simpler than that of a charge coupled device (CCD) conventionally used. Also, the CMOS image sensor can integrated a signal processing circuit in one chip and thus, a system on chip (SOC) can be achieved. Accordingly, the CMOS image sensor makes it possible to micronize a module.

Furthermore, since CMOS image sensor can compatibly use a CMOS technology conventionally set up, it is possible to reduce a cost.

FIG. 1 is a cross-sectional view illustrating a predetermined portion of a unit pixel of a conventional CMOS image sensor.

As shown in FIG. 1, a plurality of device isolation layers 12 are locally formed in a lower structure (hereinafter, referred to as a semiconductor layer) in which a highly doped $P^{++}$-type substrate 10 and a P-type epitaxial layer P-EPI 11. A gate electrode comprising a transfer gate Tx is formed by using a stacked structure of a conductive layer 14 and an insulation layer 13 and a plurality of spacers 16 on sidewalls of the stacked structure.

A photodiode PD including a P-type impurity region 17 (hereinafter, referred to as a $P^0$-type region) and an N-type impurity region 15 (hereinafter, referred to as an N-type region) formed to be aligned with one side of the gate electrode is formed inside the semiconductor layer through an ion-implantation process and a heat diffusion process.

A highly doped $N^+$-type floating diffusion region FD 18 is formed inside the semiconductor layer by being aligned with the other side of the gate electrode.

The conductive layer 14 of the gate electrode is formed by using polysilicon, tungsten silicide, or a combination thereof, and the spacers 16 are formed by using a nitride layer, an oxide layer, or an oxynitride layer.

As shown in FIG. 1, the photodiode PD is formed in a single crystal silicon substrate, i.e., the semiconductor layer.

Meanwhile, as a design rule has been decreased, a photodiode PD region has been decreased as well, and accordingly, degradation in photosensitivity is generated. It is because the photodiode PD region is formed in the single crystal substrate.

SUMMARY OF THE INVENTION

It is, therefore, an object of the present invention to provide an image sensor capable of overcoming a limitation in photosensitivity resulted from forming a photodiode in a single crystal silicon substrate, and a method for fabricating the same.

In accordance with one aspect of the present invention, there is provided an image sensor, including: a single crystal silicon substrate; an amorphous silicon layer formed inside the substrate; a photodiode formed in the amorphous silicon layer; and a transfer gate formed over the substrate adjacent to the photodiode and transferring photoelectrons received from the photodiode.

In accordance with another aspect of the present invention, there is provided with a method for fabricating an image sensor, including: forming a trench for a device isolation in a single crystal silicon substrate; forming an insulation layer filling the trench; forming an opening by etching a predetermined portion of the substrate adjacent to the trench; forming an amorphous silicon layer to fill the opening; performing a planarization process for the amorphous silicon layer filling the opening and the insulation layer filling the trench; and forming a photodiode in the planarized amorphous silicon layer.

In accordance with further aspect of the present invention, there is provided with a method for fabricating an image sensor, including: forming a trench for a device isolation in a single crystal silicon substrate; forming an insulation layer filling the trench; planarizing the insulation layer filling the trench until the insulation layer is aligned with a surface of the substrate; forming an opening by etching a predetermined portion of the substrate adjacent to the trench; forming an amorphous silicon layer to fill the opening; planarizing the amorphous silicon layer filling the opening until the amorphous silicon layer is aligned with the top surface of the substrate; and forming a photodiode on the amorphous silicon layer.

In accordance with still further aspect of the present invention, there is provided with a method for fabricating an image sensor, including: forming a trench for a device isolation in a single crystal silicon substrate; forming an insulation layer filling the trench; planarizing the insulation layer filling the trench until the insulation layer is aligned with a top surface of the substrate; forming a transfer gate apart from the trench on the substrate; forming an inter-layer insulation layer on a surface of the substrate including the transfer gate; forming an opening by etching predetermined portions of the substrate and the inter-layer insulation layer between the trench and the transfer gate; forming an amorphous silicon layer filling the opening; planarizing the amorphous silicon layer filling the opening until the amorphous silicon layer is aligned with the top surface of the substrate; recessing the planarized amorphous silicon layer to the top surface of the substrate; and forming a photodiode in the recessed amorphous silicon layer.

In accordance with still further aspect of the present invention, there is provided with a method for fabricating an image sensor, including: forming a trench for a device isolation in a single crystal silicon substrate; forming an insulation layer filling the trench; planarizing the insulation layer filling the trench until the insulation layer is aligned with a top surface of the substrate; forming a transfer gate apart from the trench on the substrate; forming an inter-layer insulation layer on a surface of the substrate including the transfer gate; forming an opening by etching predetermined portions of the inter-layer insulation layer and the substrate between the trench and the transfer gate; forming an amorphous silicon layer to cover a portion of the opening and the partially etched inter-layer insulation layer; recessing a portion of the amorphous silicon layer covering the inter-layer insulation layer; and forming a photodiode in the amorphous silicon layer.

BRIEF DESCRIPTION OF THE DRAWINGS

The above and other objects and features of the present invention will become better understood with respect to the following description of the preferred embodiments given in conjunction with the accompanying drawings, in which:

FIGS. 5A to 5D are cross-sectional views illustrating a method for fabricating a CMOS image sensor in accordance with a third embodiment of the present invention.

DETAILED DESCRIPTION OF THE INVENTION

Hereinafter, detailed descriptions of preferred embodiments of the present invention will be provided with reference to the accompanying drawings.

Figure 1:
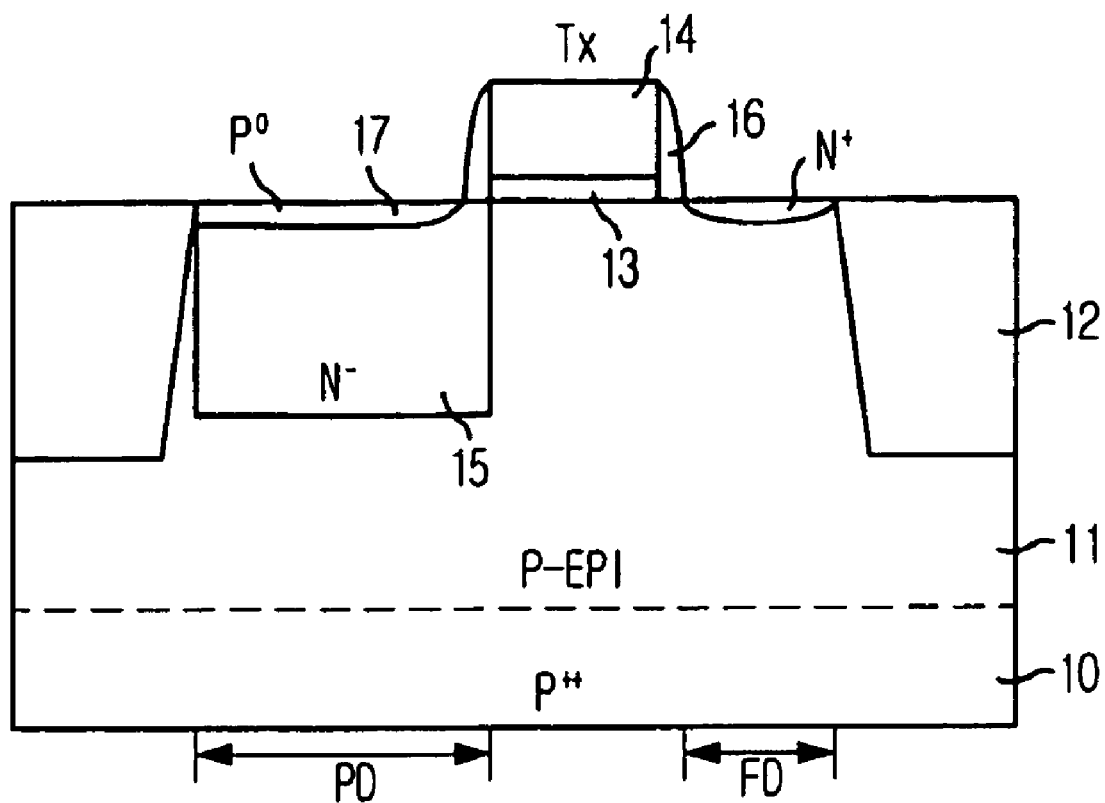
FIG. 1 is a cross-sectional view illustrating a predetermined portion of a unit pixel of a conventional complementary metal oxide semiconductor (CMOS) image sensor.
Figure 2:
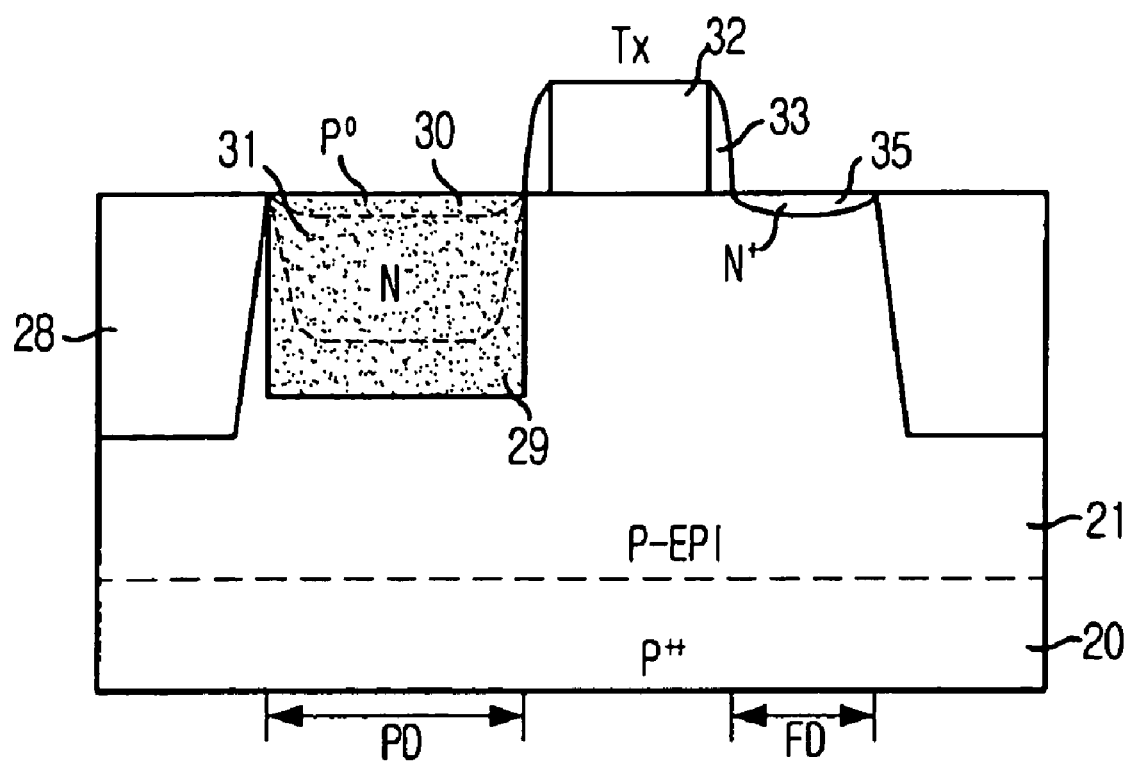
FIG. 2 is a cross-sectional view illustrating a predetermined portion of a unit pixel of an image sensor in accordance with a specific embodiment of the present invention.

FIG. 2 is a cross-sectional view illustrating a predetermined portion of a unit pixel of an image sensor in accordance with a specific embodiment of the present invention.

As shown in FIG. 2, a plurality of device isolation layers 28 are locally formed in a lower structure (hereinafter, referred to as a semiconductor layer) in which a highly doped $P^{++}$-type substrate 20 and a P-type epitaxial P-EPI 21 are formed. Herein, the semiconductor layer is a single crystal silicon layer.

A gate electrode forming a transfer gate Tx is formed in a structure including a conductive layer 32 and a plurality of spacers 33 on sidewalls of the conductive layer 32 on the semiconductor layer.

A photodiode PD including a P-type impurity region 30 (hereinafter, referred to as a $P^0$-type region) and an N-type impurity region 31 (hereinafter, referred to as an N-type region) is formed to be aligned with one side of the gate electrode inside the semiconductor layer through an ion-implantation process and a heat diffusion process.

Meanwhile, the $P^0$-type region 30 and an N-type region 31 forming the photodiode PD are not formed with the single crystal silicon layer forming the semiconductor layer but with an amorphous silicon layer.

It is possible to obtain a high photosensitivity due to a process effect resulted from a silicon material property by using a typical single crystal silicon layer.

In accordance with the specific embodiment of the present invention, to overcome this structural disadvantage, the photodiode PD is not formed in the single crystal silicon layer but in the aforementioned amorphous silicon layer 29. Meanwhile, a silicon germanium (Si—Ge) layer can be used in addition to the amorphous silicon layer 29.

A highly doped $N^+$-type floating diffusion region FD 35 is formed in the semiconductor layer aligned with the other side of the gate electrode.

The conductive layer 32 of the gate electrode is a structure formed by using polysilicon, tungsten silicide or a combination thereof. The spacers 33 are formed with use of a nitride layer, an oxide layer or an oxynitride layer.

Hereinafter, a method for fabricating the image sensor having the aforementioned constitution elements will be described. A plurality of specific embodiments of the present invention will be described.

FIGS. 3A to 3D are cross-sectional views illustrating a method for fabricating a CMOS image sensor in accordance with a first embodiment of the present invention.

Figure 3A:
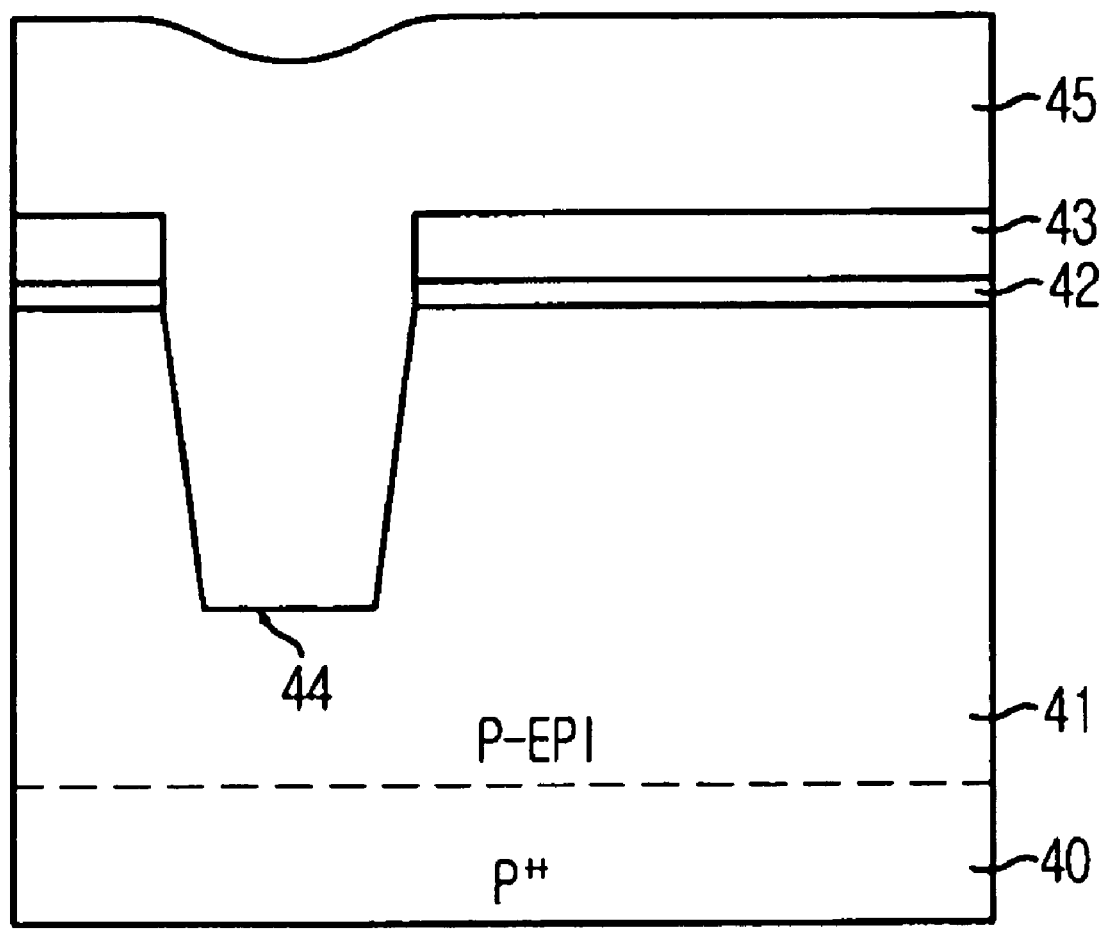
FIGS. 3A to 3D are cross-sectional views illustrating a method for fabricating a CMOS image sensor in accordance with a first embodiment of the present invention.

As shown in FIG. 3A, a trench 44 for forming a field oxide layer with a shallow trench isolation (STI) structure is formed in a P-type semiconductor layer comprised of a stacked structure of a highly doped $P^{++}$-type substrate 40 and a P-type epitaxial layer P-EPI (not shown).

A pad oxide layer (not shown) and a pad nitride layer (not shown) are deposited and then, the pad oxide layer (not shown) and the pad nitride layer (not shown) are etched by using a photoresist pattern (not shown) as an etch mask, thereby defining a trench formation region. Afterwards, the photoresist layer is removed, and the semiconductor layer is etched by using the patterned pad oxide layer 42 and the patterned pad nitride layer 43 as an etch mask, thereby forming the trench 44. Herein, a reference numeral 41 denotes a patterned P-type epitaxial layer P-EPI forming the patterned semiconductor layer.

An oxide layer 45 for forming a field oxide layer is deposited on an entire surface provided with the trench 44. The oxide layer 45 is formed through a high density plasma (HDP) method or a chemical vapor deposition (CVD) method. Next, an etching process is performed by using a planar (PL) mask.

Meanwhile, since the oxide layer 45 is formed in the trench region 44 more thickly than in the remaining regions except the trench region 44, in case that a chemical mechanical polishing (CMP) process is directly employed, dishing is severely generated around a field oxide layer. As a result, a planarization is not properly carried out. Accordingly, a mask opening an upper portion of the trench 44 is used for the purpose of partially remove the oxide layer 45 existing on the upper portion of the trench 44, and the above described mask is called the planar (PL) mask.

Figure 3B:
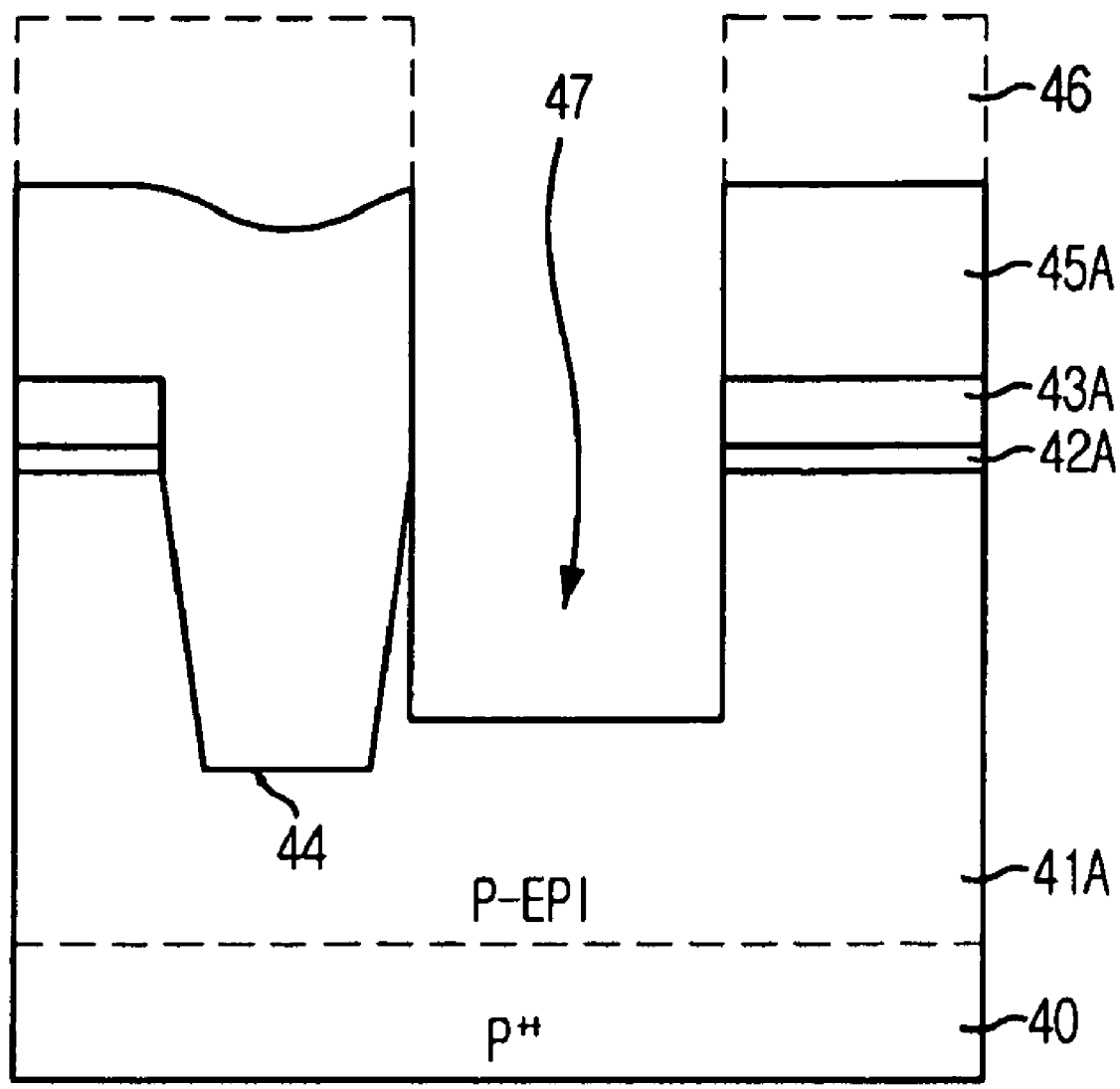

As shown in FIG. 3B, a photoresist pattern 46 which is a mask pattern opening a region in which a photodiode is formed is formed on the oxide layer 45.

The oxide layer 45, the patterned pad nitride layer 43, the patterned pad oxide layer 42 and the patterned semiconductor layer are further etched by using the photoresist pattern 46 as an etch mask, thereby forming an opening 47 opening a region in which a photodiode is formed. Herein, reference numerals 45A, 43A, and 42A denote a patterned oxide layer, a further patterned nitride layer, and a further patterned oxide layer, respectively. Also, a reference numeral 41A denotes a further patterned P-type epitaxial layer P-EPI forming a patterned semiconductor layer.

During forming the opening 47, a thickness of which the opening 47 is formed is greater than a thickness of which the photodiode PD is formed. Next, the photoresist pattern 46 is removed.

Figure 3C:
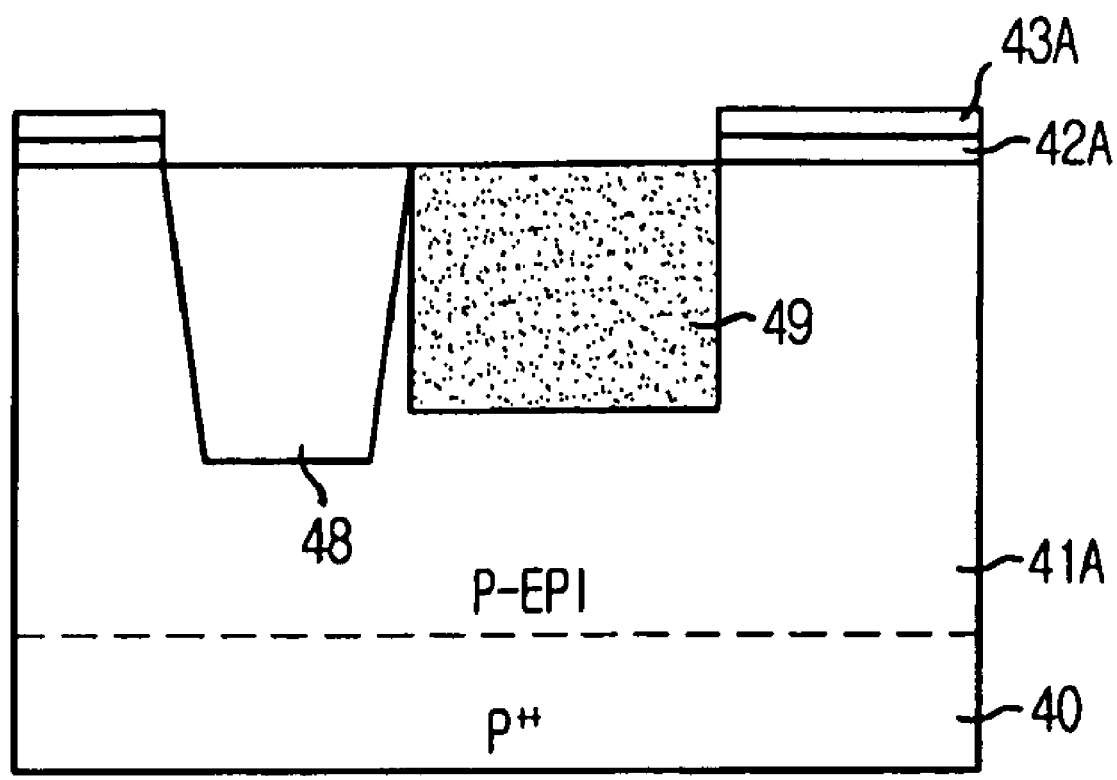

As shown in FIG. 3C, an amorphous silicon layer is deposited to sufficiently fill the opening 47. At this time, the amorphous silicon layer may be a silicon germanium (Si—Ge) layer containing germanium (Ge).

Next, a planarization process is performed to expose the further patterned pad nitride layer 43A, thereby forming a field oxide layer 48 with a STI structure as simultaneously as forming an amorphous silicon layer 49 buried in the patterned semiconductor layer. Thus, the field oxide layer 48 is aligned with the amorphous silicon layer 49.

During performing the planarization process, a CMP process is used. At this time, since a thickness of the amorphous silicon layer 49 to be polished is greater than a thickness of the oxide layer 45, a polishing material including silica and ceria having a high polishing rate with respect to a silicon layer is used as slurry. Furthermore, more than two kinds of slurry are used.

After performing the CMP process, a cleaning process is employed to remove particles by using a standard cleaning (SC)-1 solution.

The cleaning process is performed in a CMP apparatus after drying, or the cleaning process can be employed in another subsequent cleaning apparatus.

Furthermore, the planar (PL) mask formation and the etching process can be omitted after depositing the oxide layer 45, and the process using the planar (PL) mask can be performed after depositing the amorphous silicon layer 49.

Figure 3D:
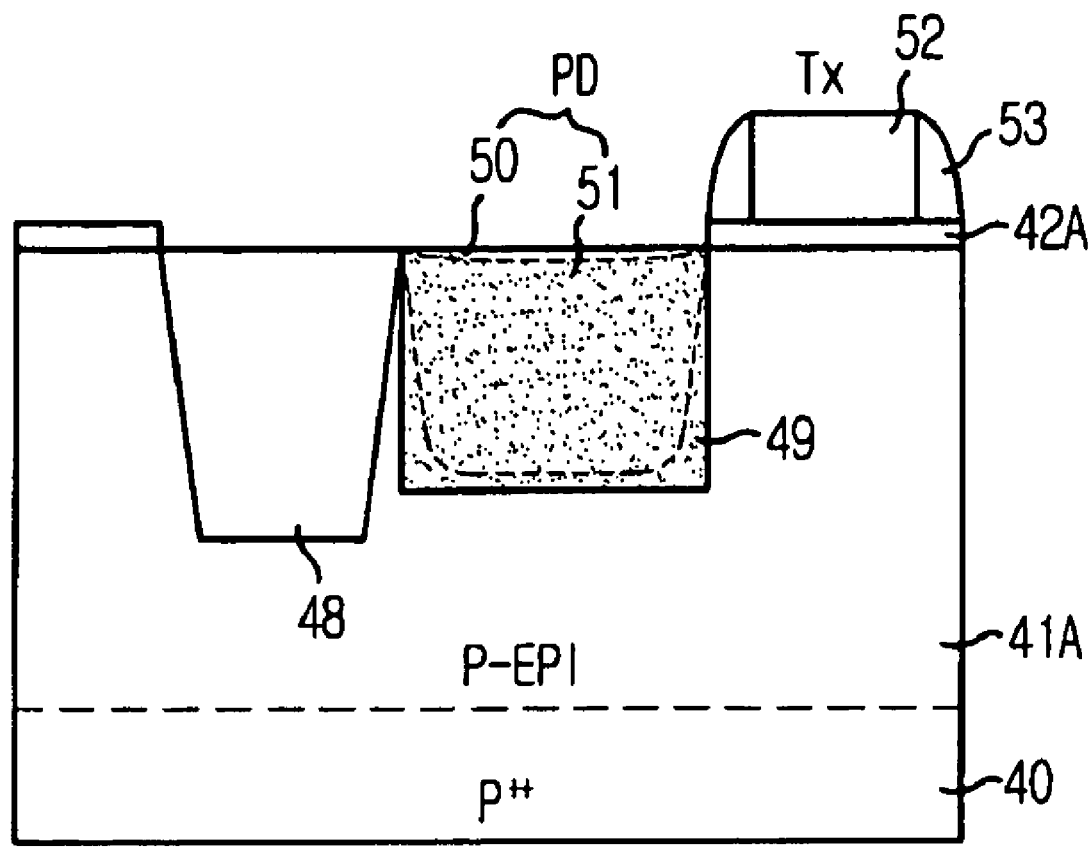

As shown in FIG. 3D, a gate electrode, i.e., a transfer gate Tx, including a conductive layer 52 and a plurality of spacers 53 is formed. Afterwards, an ion-implantation process is performed onto the amorphous silicon layer 49, thereby forming a photodiode PD comprised of a $P^0$-type region 50 and an N-type region 51.

Figure 4A:
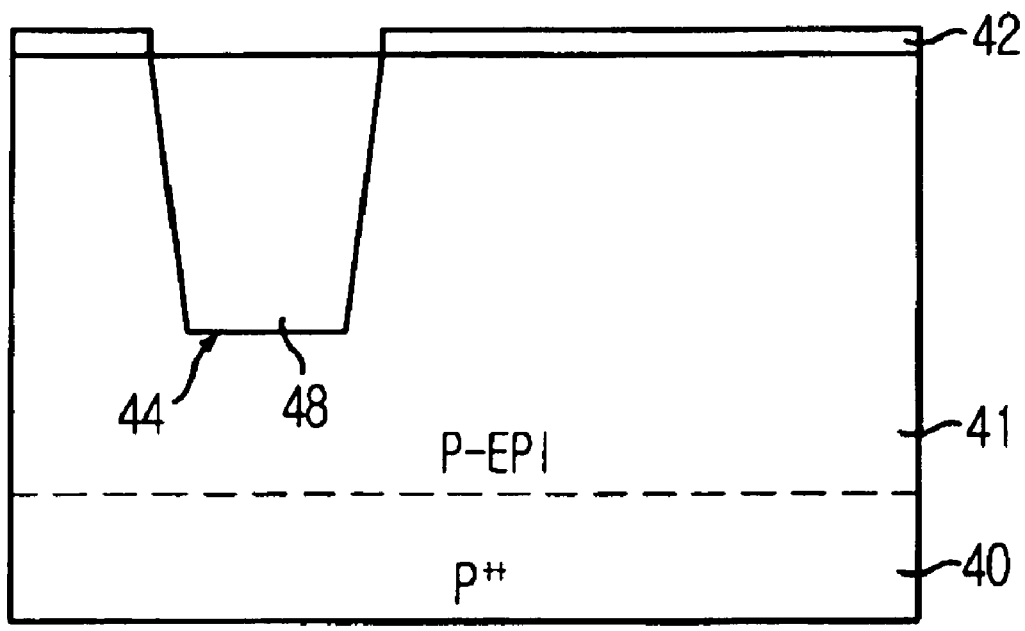
FIGS. 4A to 4C are cross-sectional views illustrating a method for fabricating a CMOS image sensor in accordance with a second embodiment of the present invention.
Figure 4B:
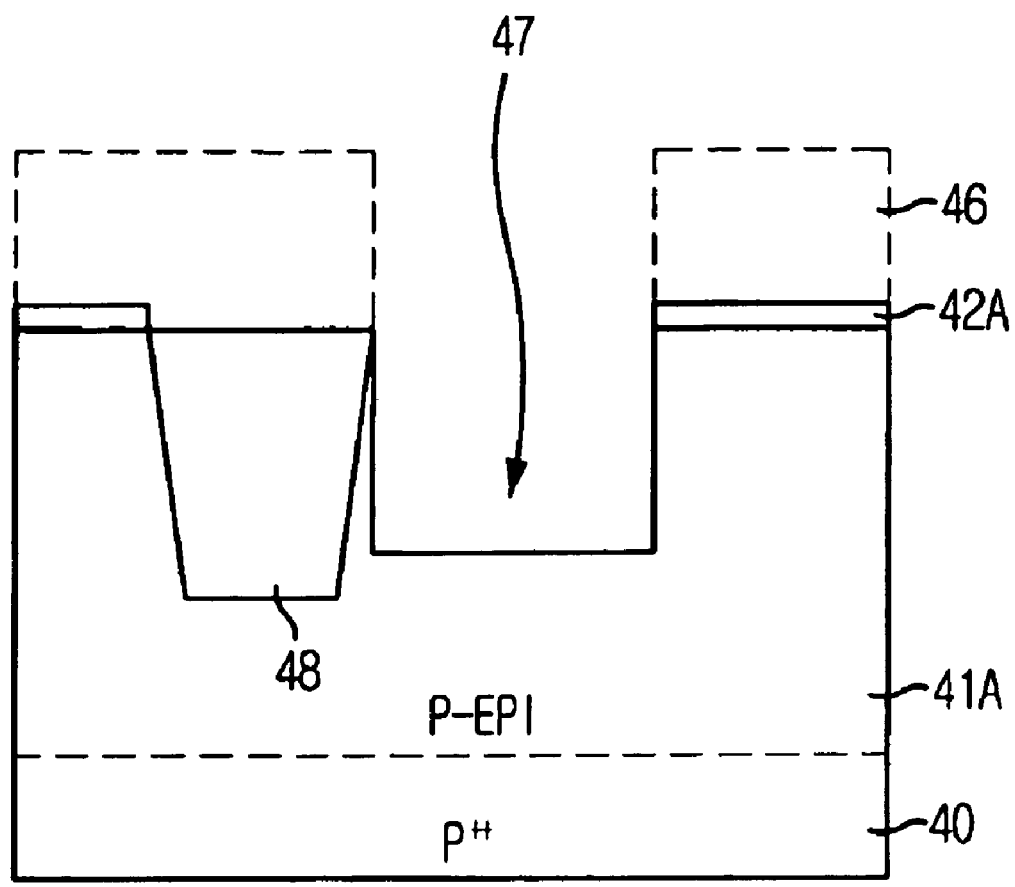
Figure 4C:
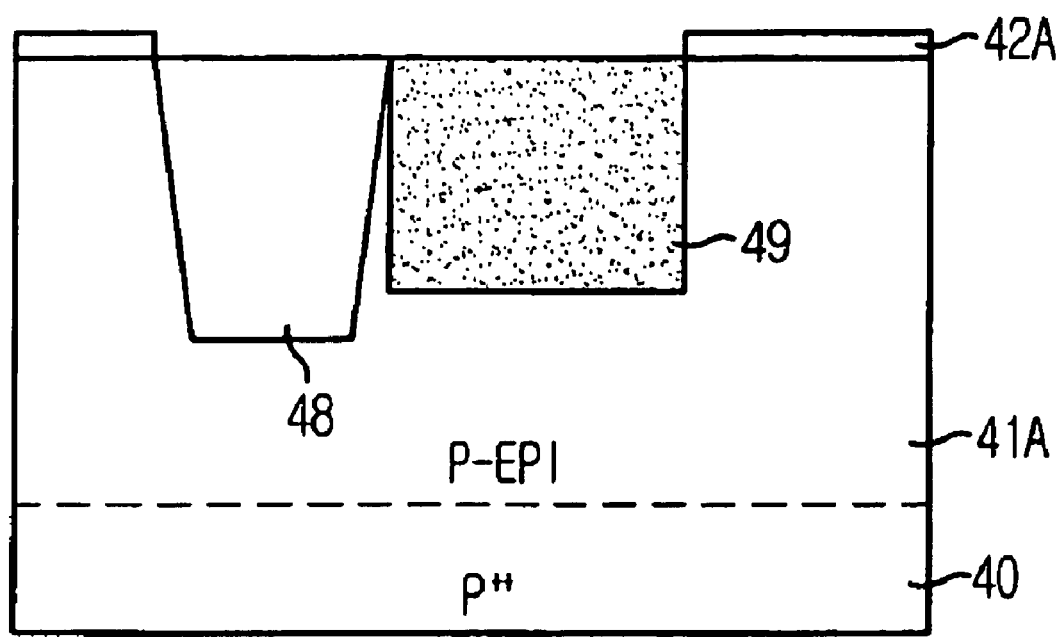

FIGS. 4A to 4C are cross-sectional views illustrating a method for fabricating a CMOS image sensor in accordance with a second embodiment of the present invention.

Meanwhile, the same reference numerals are used with respect to the same constitution elements identical with those of the first embodiment of the present invention, and detailed explanations about the identical constitution elements are omitted.

As shown in FIG. 4A, a trench 44 for forming a field oxide layer with a STI structure is formed in a P-type semiconductor layer comprised of a P-type epitaxial layer (not shown) and a highly doped $P^{++}$-type substrate 40. For instance, a pad oxide layer (not shown) and a pad nitride layer (not shown) are deposited and then, the pad oxide layer (not shown) and the pad nitride layer (not shown) are etched by using a photoresist pattern (not shown) as an etch mask, thereby defining a trench formation region. Thereafter, the photoresist pattern is removed and then, the semiconductor layer is etched by using the patterned pad oxide layer 42 and the patterned pad nitride layer (not shown). Thus, the trench 44 is formed. Herein, a reference numeral 41 denotes a patterned P-type epitaxial layer.

An oxide layer for forming a field oxide layer is deposited on an entire surface provided with the trench 44. Then, an etching process is employed by using a planar (PL) mask.

A planarization process is performed to expose the patterned pad nitride layer (not shown), thereby forming a field oxide layer 48 with a STI structure. The field oxide layer 48 is aligned with a surface of the substrate 40.

During the planarization process, a CMP process is used. Next, the patterned pad nitride layer (not shown) is removed. Meanwhile, the patterned pad nitride layer can be removed after a subsequent planarization process subjected to an amorphous silicon layer.

As shown in FIG. 4B, a photoresist pattern 46 which is a mask pattern opening a photodiode formation region is formed on an upper portion in which the field oxide layer 48 is formed.

The patterned oxide layer 42 and the patterned semiconductor layer are etched by using the photoresist pattern 46 as an etch mask, thereby forming an opening 47 opening a photodiode formation region. Herein, a reference numeral 42A denotes a further patterned oxide layer and a reference numeral 41A denotes a further patterned P-type epitaxial layer.

During forming the opening 47, a thickness in which the opening 47 is formed is greater than a thickness in which the photodiode is formed. Next, the photoresist pattern 46 is removed.

As shown in FIG. 4C, an amorphous silicon layer is deposited to sufficiently fill the opening 47. At this time, the amorphous silicon may be a silicon germanium (Si—Ge) layer containing Ge.

Next, a planarization process is performed to expose the further patterned pad oxide layer 42A. Thus, the further patterned pad oxide layer 42A is practically planarized with the field oxide layer 48 with the STI structure, and the amorphous silicon layer 49 buried in the further patterned semiconductor layer is formed. The amorphous silicon layer is aligned with the top surface of the substrate.

During the planarization process, a CMP process is used. At this time, a polishing material including silica and ceria is used as slurry. Furthermore, more than two kinds of slurry are used.

As the slurry used for polishing the amorphous silicon layer 49, slurry having high selectivity rate of which a polishing rate with respect to silicon is high and a polishing rate with respect to silicon oxide ($SiO_2$) and silicon nitride ($Si_3N_4$/SiON/SiN) is low is used. For instance, the slurry of which the polishing selectivity rate of silicon to $SiO_2$ is approximately 5 to approximately 1 is used.

After performing the CMP process, a cleaning process is employed by using a SC-1 solution to remove particles.

The cleaning process can be performed in a CMP apparatus after drying, or the cleaning process can be performed in another subsequent cleaning apparatus.

Furthermore, the planar (PL) mask formation and the etching process can be omitted after depositing the oxide layer 35, and the process using the PL mask can be performed after depositing the amorphous silicon layer 49.

Hereinafter, refer to FIG. 3D for a subsequent process. A gate electrode including a conductive layer 52 and a plurality of spacers 53, i.e., a transfer gate Tx, is formed. Afterwards, an ion-implantation process is performed onto the amorphous silicon layer 49, thereby forming a photodiode PD comprised of a $P^0$-type region 50 and an N-type region 51.

FIGS. 5A to 5D are cross-sectional views illustrating a method for fabricating a CMOS image sensor in accordance with a third embodiment of the present invention.

Meanwhile, the same reference numerals are used with respect to the same constitution elements identical with those of the first embodiment of the present invention, and detailed explanations about the identical constitution elements are omitted.

Figure 5A:
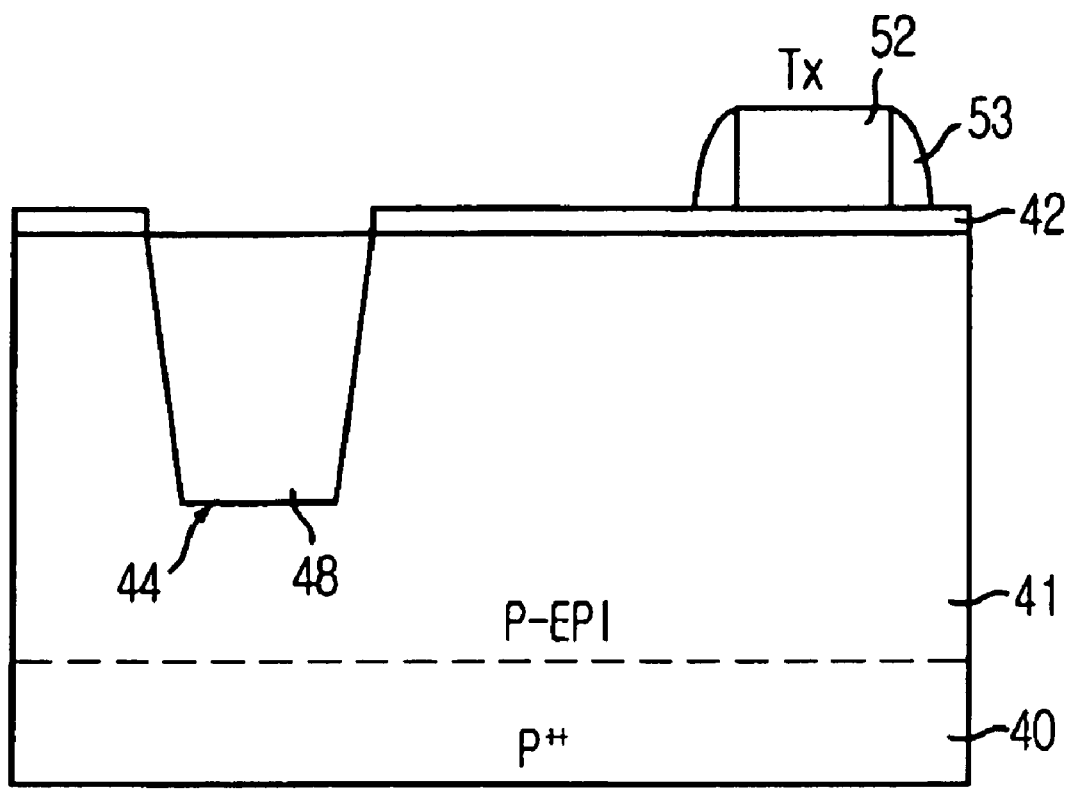

As shown in FIG. 5A, a trench 44 for forming a field oxide layer with a STI structure is formed in a P-type semiconductor layer comprised of a P-type epitaxial layer (not shown) and a highly doped $P^{++}$-type substrate 40. For instance, a pad oxide layer (not shown) and a pad nitride layer (not shown) are deposited and then, the pad oxide layer (not shown) and the pad nitride layer (not shown) are etched by using a photoresist pattern (not shown) as an etch mask, thereby defining a trench formation region. Thereafter, the photoresist pattern is removed and then, the semiconductor layer is etched by using the patterned pad oxide layer 42 and the patterned pad nitride layer (not shown). Thus, the trench 44 is formed. Herein, a reference numeral 41 denotes a patterned P-type epitaxial layer.

An oxide layer for forming a field oxide layer is deposited on an entire surface provided with the trench 44. Then, an etching process is employed by using a planar (PL) mask.

A planarization process is performed to expose the patterned pad nitride layer (not shown), thereby forming a field oxide layer 48 with a STI structure. The field oxide layer 48 is aligned with a top surface of the substrate 40.

During the planarization process, a CMP process is used. Next, the patterned pad nitride layer (not shown) is removed. Meanwhile, the patterned pad nitride layer can be removed after a subsequent planarization process subjected to an amorphous silicon layer.

A gate electrode Tx comprised of a conductive layer 52 and a plurality of spacers 53 are formed on the patterned semiconductor layer apart from the field oxide layer 48.

Figure 5B:
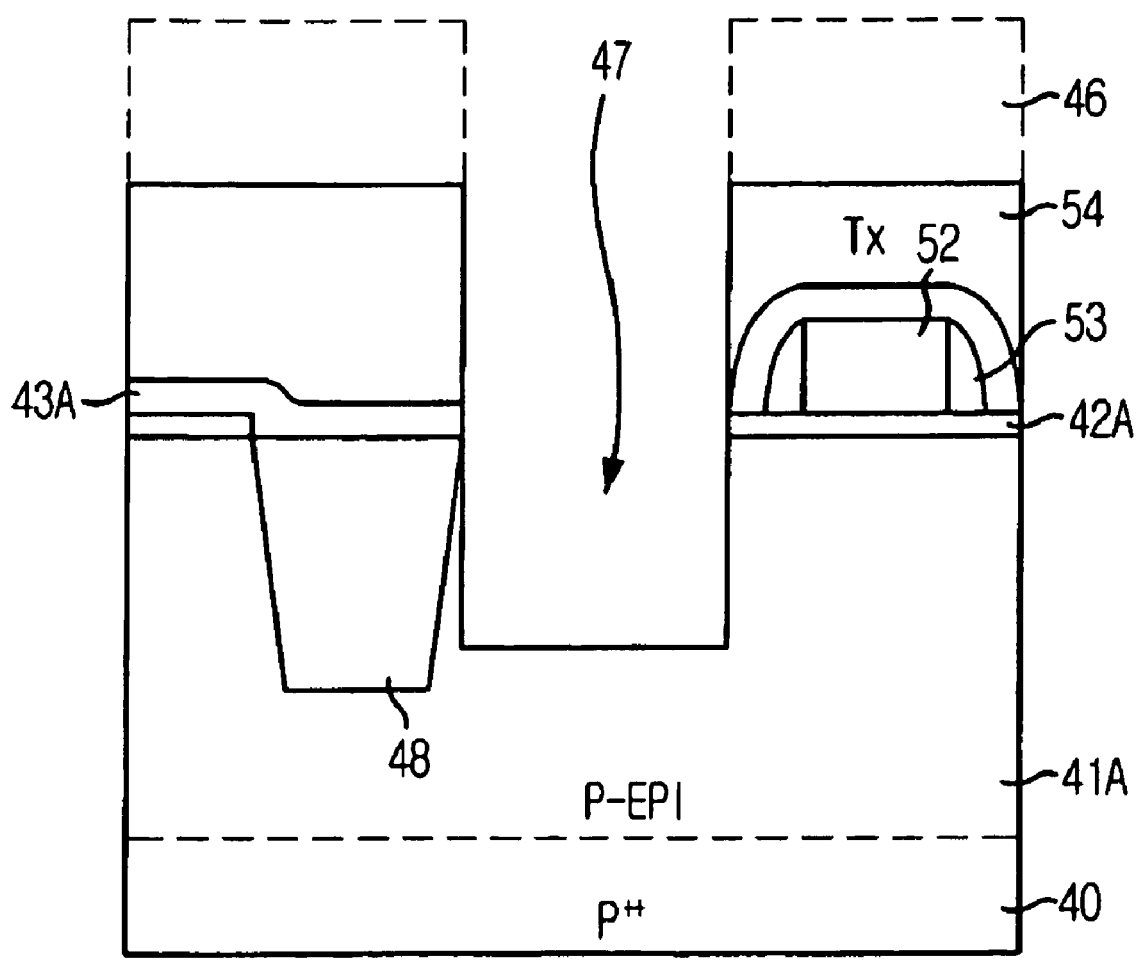

As shown in FIG. 5B, an inter-layer insulation layer (not shown) is formed on an entire surface provided with the field oxide layer 48 and the gate electrode Tx. The inter-layer insulation layer (not shown) is formed by using a typical oxide based layer such as $SiO_2$.

A photoresist pattern 46 which is a mask pattern opening a photodiode formation region is formed on the inter-layer insulation layer (not shown).

The inter-layer insulation layer (not shown), the patterned pad nitride layer 43, the patterned pad oxide layer 42 and the patterned semiconductor layer are etched, thereby forming an opening 37 opening a region in which a photodiode is formed. Herein, reference numerals 54, 43A, and 42A denote a patterned inter-layer insulation layer, a further patterned pad nitride layer, and a further patterned pad oxide layer, respectively. Also, a reference numeral 41A denotes a further patterned p-type Epitaxial layer.

During forming the opening 47, a thickness in which the opening 47 is formed is greater than a thickness in which a photodiode is formed. Next, the photoresist pattern 46 is removed.

Figure 5C:
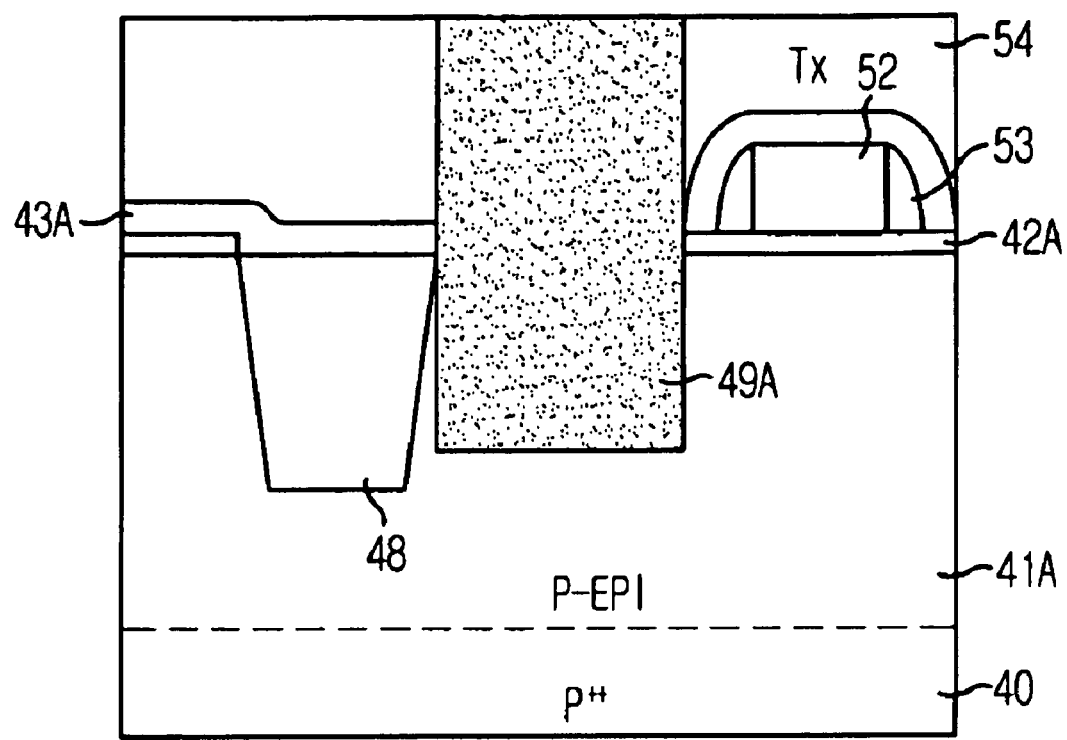

As shown in FIG. 5C, an amorphous silicon layer is formed to sufficiently fill the opening 47. At this time, the amorphous silicon layer may be a silicon-germanium (Si—Ge) layer containing Ge.

Next, a planarization process is performed to expose a patterned inter-layer insulation layer 54, thereby forming a planarized amorphous silicon layer 49A substantially planarized with the patterned inter-layer insulation layer 54. The planarized amorphous silicon layer is aligned with the top surface of the substrate.

During the planarization process, a CMP process is used. At this time, a polishing material including silica and ceria is used as slurry. Furthermore, more than two kinds of slurry are used.

As the slurry used for polishing the amorphous silicon layer 49, slurry having high selectivity rate of which a polishing rate with respect to silicon is high and a polishing rate with respect to silicon oxide ($SiO_2$) and silicon nitride ($Si_3N_4$/SiON/SiN) is low is used. For instance, the slurry of which the polishing selectivity rate of silicon to $SiO_2$ is equal to or more than approximately 5 to approximately 1, i.e., the polishing selectivity rate of silicon to $SiO_2$ is maintained between approximately 5:1 and approximately 30:1, is used.

After performing the CMP process, a cleaning process is employed by using a SC-1 solution to remove particles.

The cleaning process can be performed in a CMP apparatus after drying, or the cleaning process can be performed in another subsequent cleaning apparatus.

As shown in FIG. 5D, an etch back process is performed and thus, the amorphous silicon layer 49 is practically buried in the semiconductor layer.

Next, an ion-implantation process is performed onto the amorphous silicon layer 49, thereby forming a photodiode PD comprised of a $P^0$-type region 50 and an N-type region 51.

Meanwhile, during performing the process shown in FIG. 5C, the amorphous silicon layer 49A can be partially buried instead of being deposited in the entire surface of the opening 47. This case will be examined hereinafter.

Figure 6A:
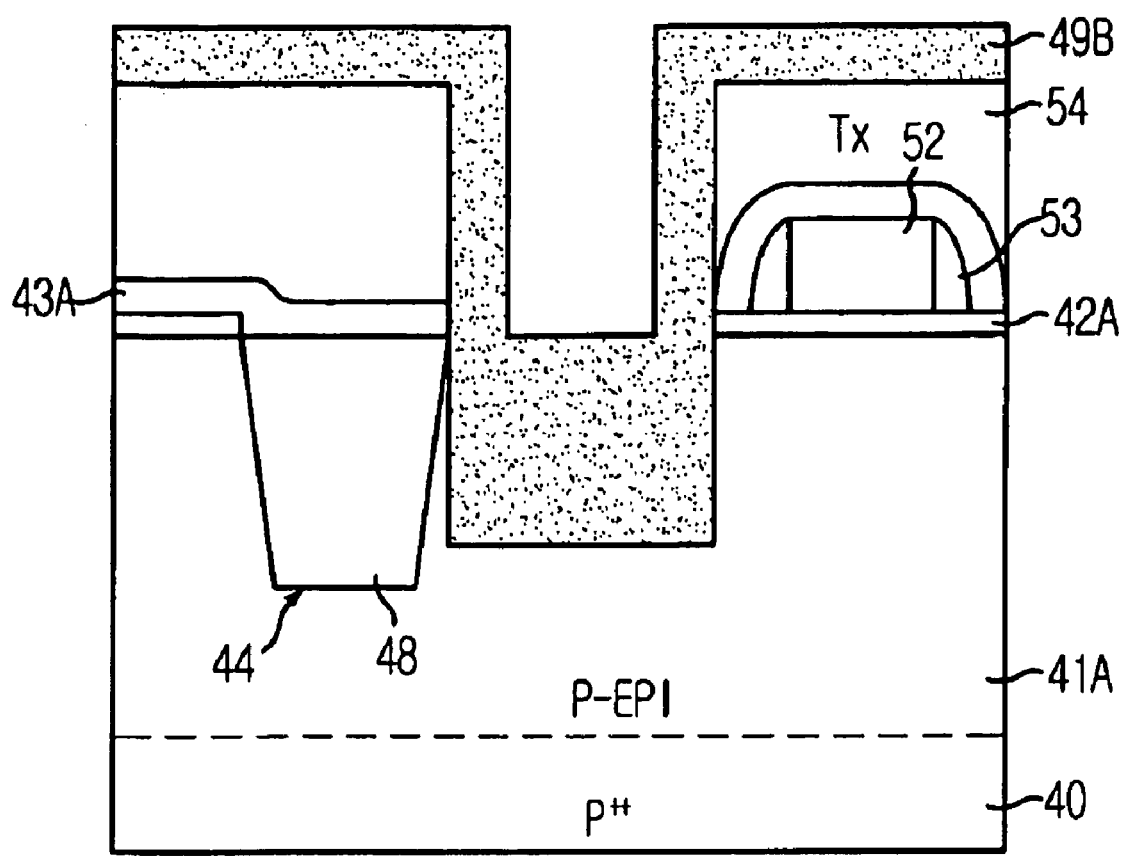
FIGS. 6A and 6B are cross-sectional views illustrating a method for fabricating a CMOS image sensor in accordance with a fourth embodiment of the present invention.
Figure 6B:
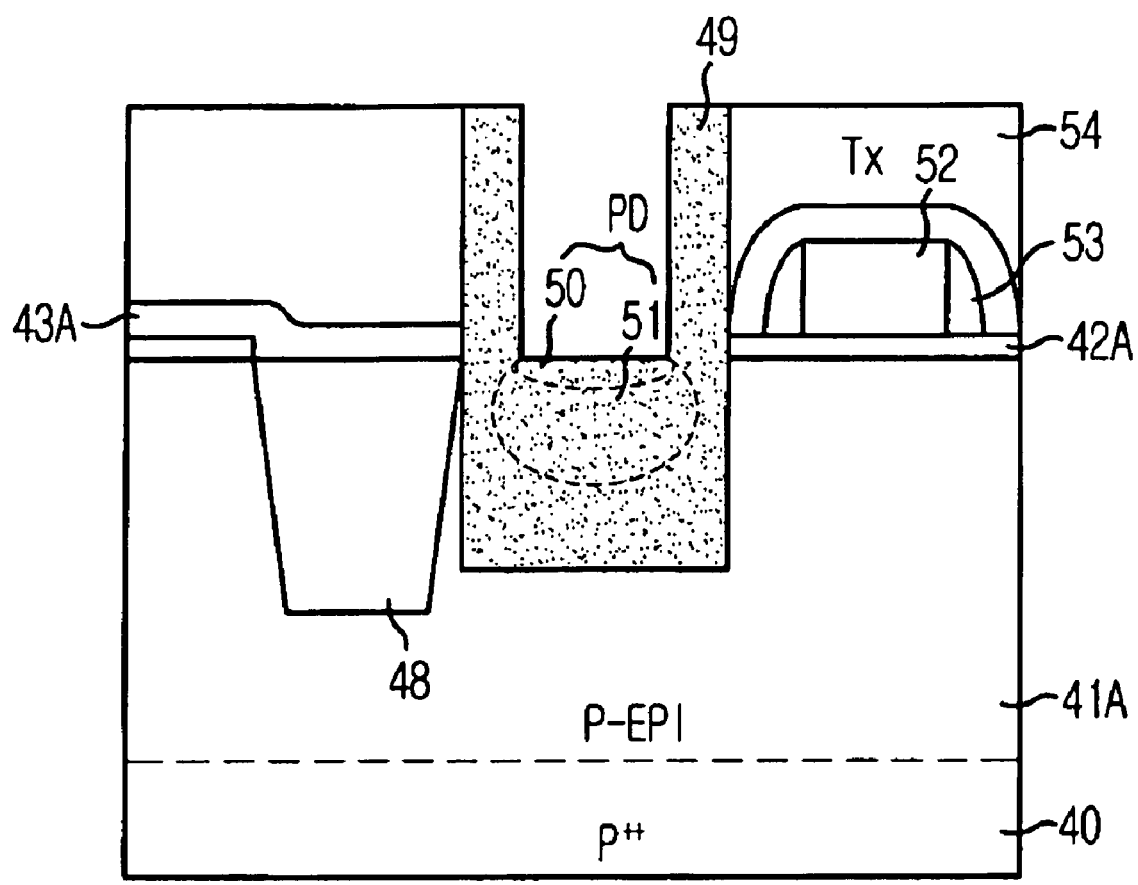

FIGS. 6A and 6B are cross-sectional view illustrating a CMOS image sensor in accordance with a fourth embodiment of the present invention.

Meanwhile, the same reference numerals are used with respect to the same constitution elements identical with those of the first embodiment of the present invention, and detailed explanations about the identical constitution elements are omitted.

In FIG. 6A, after a process shown in FIG. 5 is completed, an amorphous silicon layer 49B is formed to fill a predetermined portion of the opening 47.

As shown in FIG. 6B, a planarization process is performed to expose the patterned inter-layer insulation layer 54 and thus, a planarized amorphous silicon layer 49 of which portions formed on sidewalls of the opening 47 are substantially planarized with the patterned inter-layer insulation layer 54. The planarized amorphous silicon layer 49 is aligned with a top surface of the substrate.

During performing the planarization, a CMP process is used. At this time, the above described slurry is identically used.

After the CMP process, a cleaning process is performed by using a SC-1 solution to remove particles.

Next, an ion-implantation process is employed on the amorphous silicon layer 49 and thus, a photodiode PD comprised of a $P^0$-type region 50 and an N-type region 51 is formed.

Meanwhile, during the planarization, a photoresist layer is deposited to fill an empty space of the opening 47. Afterwards, the planarization process is performed and then, the photoresist layer is removed. Thereafter, an etch back process can be employed.

In accordance with the present invention, an amorphous silicon layer is formed in a region in which a photodiode is formed and the photodiode is formed on the amorphous silicon layer. Thus, it is possible to overcome a limitation in photosensitivity of a single crystal silicon substrate.

It is possible to obtain an effect greatly improving capability of an image sensor because photosensitivity of the image sensor can be greatly improved in accordance with the present invention.

The present application contains subject matter related to the Korean patent application No. KR 2004-0115974, filed in the Korean Patent Office on Dec. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating an image sensor including a photodiode, the method comprising:
   etching, with an etch mask, an opening in an epitaxial layer;
   depositing an amorphous silicon layer into the opening; and
   implanting ions in the amorphous silicon layer to form a P-region of amorphous silicon and an N-region of amorphous silicon;
   wherein the etch mask includes a photoresist pattern; and
   wherein the photodiode includes the P-region of amorphous silicon and the N-region of amorphous silicon.

2. The method of claim 1, further comprising:
   etching a trench in the epitaxial layer; and
   depositing an oxide layer into the trench.

3. The method of claim 2, further comprising:
   planarizing the oxide layer to form a shallow trench isolation structure; and
   aligning the amorphous silicon layer with the shallow trench isolation structure.

4. The method of claim 3, wherein said planarizing the oxide layer comprises using a slurry including a polishing selectivity rate of silicon to silicon oxide between approximately 5:1 to approximately 30:1.

5. The method of claim 2, wherein said planarizing the oxide layer is performed before said implanting ions in the amorphous silicon layer.

6. The method of claim 1, further comprising forming a transfer gate adjacent to the photodiode.

7. The method of claim 6, wherein said forming a transfer gate is performed before said implanting ions in the amorphous silicon layer.

8. The method of claim 1, wherein the amorphous silicon layer comprises germanium.

9. The method of claim 1, further comprising performing a heat diffusion process to form the photodiode.

10. The method of claim 1, wherein the opening comprises a depth greater than the thickness of the photodiode.

11. The method of claim 1, wherein the amorphous silicon layer is partially buried within the opening.

12. A method for fabricating an image sensor including a photodiode, the method comprising:
    forming a trench in an epitaxial layer;
    forming an insulation layer in the trench;
    aligning the insulation layer with a surface of the epitaxial layer;
    etching, with a first photoresist pattern, a portion of the epitaxial layer adjacent to the trench to form an opening;
    depositing an amorphous silicon layer in the opening;
    aligning the amorphous silicon layer with the top surface of the epitaxial layer; and
    forming a P-region of amorphous silicon and an N-region of amorphous silicon in the amorphous silicon layer;
    wherein the photodiode includes the P-region of amorphous silicon and the N-region of amorphous silicon.

13. The method of claim 12, wherein the amorphous silicon layer comprises germanium.

14. The method of claim 12, wherein said forming a P-region of amorphous silicon and an N-region of amorphous silicon comprises implanting ions in the amorphous silicon layer.

15. The method of claim 14, wherein said forming a P-region of amorphous silicon and an N-region of amorphous silicon comprises performing a heat diffusion process.

16. The method of claim 12, wherein said forming a trench in an epitaxial layer comprises using a second photoresist pattern.

17. The method of claim 12, further comprising forming a transfer transistor before said forming a photodiode.

18. The method of claim 12, wherein the amorphous silicon layer is partially buried within the opening.

* * * * *